United States Patent
Wang et al.

(10) Patent No.: US 12,434,904 B2
(45) Date of Patent: Oct. 7, 2025

(54) PLATE LOADING DEVICE AND PLATE LOADING METHOD USING THE SAME

(71) Applicant: Samsung Display Co., LTD., Yongin-si (KR)

(72) Inventors: Ji Young Wang, Yongin-si (KR); Yong-Kyun Sim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 16 days.

(21) Appl. No.: 18/350,131

(22) Filed: Jul. 11, 2023

(65) Prior Publication Data

US 2024/0101338 A1    Mar. 28, 2024

(30) Foreign Application Priority Data

Sep. 27, 2022  (KR) .................. 10-2022-0122642

(51) Int. Cl.
*B65D 85/38*    (2006.01)
*B65D 81/05*    (2006.01)
*B65D 85/48*    (2006.01)

(52) U.S. Cl.
CPC ............. *B65D 85/38* (2013.01); *B65D 81/05* (2013.01); *B65D 85/48* (2013.01)

(58) Field of Classification Search
CPC ........ B65D 81/05; B65D 85/48; B65D 81/02; B65D 85/38; B65D 85/30; H01L 21/673
USPC .............. 206/710, 711, 449, 454, 448, 386; 211/153, 119.003, 90.01
See application file for complete search history.

(56) References Cited

U.S. PATENT DOCUMENTS

| | | | | |
|---|---|---|---|---|
| 4,450,960 | A * | 5/1984 | Johnson | H01L 21/67379 206/508 |
| 7,334,691 | B2 * | 2/2008 | Liu | H01L 21/6734 211/41.18 |
| 7,559,730 | B2 * | 7/2009 | Song | H01L 21/6734 414/217 |
| 11,491,390 | B1 * | 11/2022 | Piumarta | A63C 17/017 |
| 2006/0226094 | A1 * | 10/2006 | Cho | B65G 49/062 211/41.18 |
| 2012/0080354 | A1 * | 4/2012 | Heo | H01L 21/6734 206/710 |
| 2014/0326686 | A1 * | 11/2014 | Li | B65D 85/48 211/41.1 |
| 2016/0135592 | A1 * | 5/2016 | Hong | G02F 1/1303 211/26 |

(Continued)

FOREIGN PATENT DOCUMENTS

KR  10-1162032    7/2012
KR  10-2013-0015621  2/2013

(Continued)

*Primary Examiner* — Rafael A Ortiz
(74) *Attorney, Agent, or Firm* — Sughrue Mion, PLLC

(57) ABSTRACT

A plate loading device according to an embodiment includes an upper frame and a lower frame that face each other and are spaced apart from each other in a first direction, multiple side members disposed between the upper frame and the lower frame that extend in the first direction, and multiple supporting parts, wherein the side members include a first side member and a second side member facing each other, the first side member and the second side member each have multiple holes, and multiple supporting parts pass through respective ones of the holes.

13 Claims, 8 Drawing Sheets

(56) References Cited

U.S. PATENT DOCUMENTS

2021/0061517 A1\* 3/2021 Nakayama ................ G09F 9/00

FOREIGN PATENT DOCUMENTS

| KR | 10-1567323 | 11/2015 |
|----|------------|---------|
| KR | 10-2022-0049887 | 4/2022 |

\* cited by examiner

FIG. 7

| Items | | Comparative example | Embodiment example |
|---|---|---|---|
| Process inferiority rate | Cracking | 5.2% | 0% |
| | Chipping | 1.8% | 1.0% |
| | Scratch | 2.9% | 1.9% |
| Transshipment speed | | 6.2sec /1pcs | 5.1sec/1pcs |

PLATE LOADING DEVICE AND PLATE LOADING METHOD USING THE SAME

CROSS-REFERENCE TO RELATED APPLICATION

This application claims priority under 35 U.S.C. § 119 from Korean Patent Application No. 10-2022-0122642 filed in the Korean Intellectual Property Office on Sep. 27, 2022, the entire contents of which are incorporated herein by reference.

BACKGROUND

1. Technical Field

The disclosure relates to a plate loading device and a plate loading method using the same.

2. Description of the Related Art

Display devices such as an organic light emitting display and a liquid crystal display include a display panel manufactured by forming several layers and elements on a substrate. Recently, a flexible display panel and a flexible display device including the same have been developed.

The flexible display device may be classified into a bendable display device, a foldable display device, and a rollable display device depending on a use or a shape. To make the display device flexible, the display device may include a thin glass substrate or plate such as a window. In addition to the flexible display devices, a thin plate may be used as substrates or windows to realize the thin display device.

During the manufacturing process of the display device, defects such as cracks during loading or transshipping the thin plate on the loading device for various process steps may readily occur.

The above information disclosed in this Background section is only for enhancement of understanding of the background of the invention, and therefore it may contain information that does not form the prior art under 35 U.S.C. § 102 that may be already known in this country to a person of ordinary skill in the art.

SUMMARY

Embodiments of the disclosure are to provide a plate loading device and a plate loading method using the same, which may reduce the occurrence of defects such as cracks during loading or transshipping the plate during the manufacturing process of the display device.

A plate loading device according to an embodiment may include an upper frame facing and spaced-apart from a lower frame in a first direction, a plurality of side members disposed between the upper frame and the lower frame and extending in the first direction, wherein the plurality of side members may include a first side member and a second side member facing each other, and the first side member and the second side member may each include a plurality of holes, and a plurality of supporting parts that pass through the plurality of holes, respectively, the plate loading device may load a plurality of plates sequentially in the first direction.

The plurality of holes may be arranged in the first direction.

The spacing between neighboring ones of the plurality of holes arranged in the first direction may be constant.

Each of the supporting parts includes a body penetrating one of the plurality of holes, a head connected to an end of the body, and an end part connected to another end of the body.

The body may be movable in the hole in a direction passing through the hole.

A shape of the body may be selected from a cylinder, an elliptic cylinder, and a polygonal prism.

The head may include a portion having a greater width than a largest width of the hole, and a center of mass of the supporting part may be disposed at the head.

A lower surface of each of the plurality of plates loaded into the plate loading device may directly contact the head of ones of the plurality of supporting parts.

The end part may have a greater width than a largest width of the hole.

The plurality of side members may further include a plurality of third side members disposed between the plurality of supporting parts that face each other, and a spacing between ones of the plurality of third side members may be smaller than a length of an edge of each of the plates loaded into the plate loading device that is closest to the plurality of third side members.

During a loading process of the plurality of plates, the edge of the plurality of plates may slide in contact with the plurality of third side members.

Ones of the plurality of supporting parts that support one of the plurality of plates may protrude inward more than others of the supporting parts disposed above the ones of the plurality of supporting parts that support the plurality of plates.

The first side member and the second side member may each extend in a direction perpendicular to the inclined surface.

A supporter disposed under the lower frame may be further included, the supporter may include a bottom surface and an inclined surface with an inclination angle greater than 0 degrees with respect to the bottom surface.

A plate loading device according to an embodiment may that includes a plurality of first side members facing a plurality of second side members, wherein a plurality of holes may be disposed in the plurality of first side members and the plurality of second side members, a plurality of third side members may be disposed between the plurality of first side members and the plurality of second side members, and a plurality of supporting parts respectively may be disposed in the plurality of holes disposed in the plurality of first side members and the plurality of second side members, wherein each of the plurality of first side members, the plurality of second side members, and the plurality of third side members may extend in a first direction in which each of a plurality of plates is loaded, and each of the plurality of supporting parts may be movable in a corresponding one of the plurality of holes in a second direction perpendicular to the first direction.

Each of the plurality of supporting parts may include a body penetrating one of the plurality of holes, a head connected to an end of the body, and an end part connected to another end of the body.

During a loading of each of the plurality of plates, an edge of each of the plurality of plates may slide in contact with the plurality of third side members.

Ones of the plurality of supporting parts that support one of the plurality of plates may protrude inward more than others of the plurality of supporting parts that are positioned above the ones of the plurality of supporting parts that support the one of the plurality of plates.

A method of loading a plurality of plates into a plate loading device, the method may include providing a first side member and a second side member extending in a first direction, an upper and a lower frame, and a plurality of supporting parts, loading the plurality of plates in turn starting from the lower frame and going towards the upper frame, wherein ones of the plurality of supporting parts through which one of the plurality of plates passes may be pulled outward, and others of the plurality of supporting parts that correspond to the one plate being loaded may protrude inward to support the one plate, and rotating the plate loading device by about 90 degrees to stand the loaded plurality of plates within the plate loading device on a peripheral edge.

Each of the plurality of supporting parts may include a head connected to a body, the head being in direct contact with one of the plurality of plates, and upon the rotating the plate loading device by about 90 degrees, the head may be directed downwards from the body.

According to embodiments, it is possible to provide the plate loading device and the plate loading method using the same, which may reduce the occurrence of defects such as cracking during loading or transshipping the plate during the manufacturing process of the display device.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 7 is a table comparing characteristics of a plate loading device according to one comparative example and one embodiment.

DETAILED DESCRIPTION OF THE EMBODIMENTS

Figure 1:
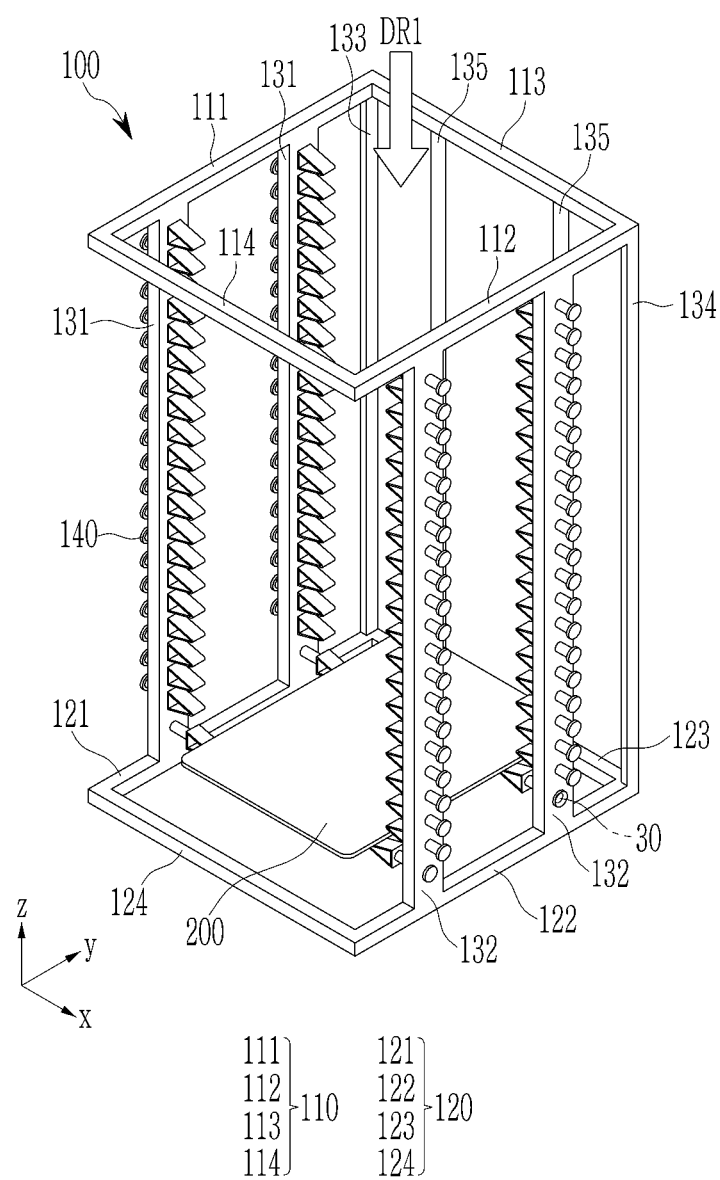
FIG. 1 is a perspective view of a plate loading device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Figure 2:
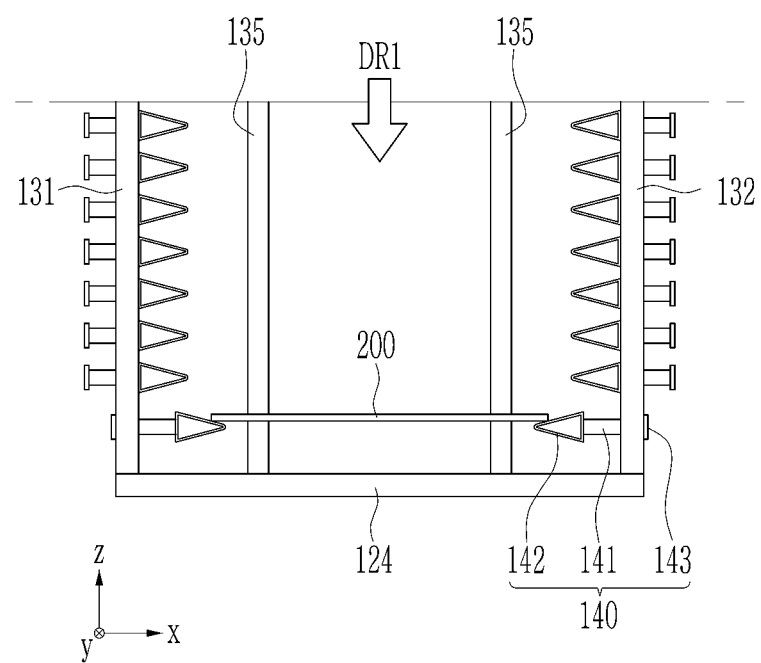
FIG. 2 is a front view of a plate loading device according to an embodiment.

First, a plate loading device according to one embodiment will be described with reference to FIGS. 1 to 3. FIG. 1 is a perspective view of a plate loading device according to an embodiment, and FIG. 2 is a front view of a plate loading device according to an embodiment.

Referring to FIG. 1, a plate loading device 100 according to an embodiment is a device for loading multiple plates 200 such as a substrate or a window to proceed with a process, and may be also called a plate loading cassette. The substrate, the window, etc. may be plates that may be included in a display device, and for example, multiple transistors, multiple light-emitting elements, etc. may be disposed on the substrate to form a display panel, and the window may be attached to the upper part of the display panel to perform a cover function.

A manufacturing process of the display device including the plate 200 includes several processes, for example, an etching process, a cleaning process, a strengthening process, an inspection process, etc. for multiple plates 200 loaded on the plate loading device 100. Here, the etching process may include a chemical treatment process.

Referring to FIG. 1, the plate loading device 100 according to an embodiment includes an upper frame 110, a lower frame 120, multiple side members 131, 132, 133, 134, and 135, and multiple supporting parts 140. The upper frame 110 and the lower frame 120 may face each other and be substantially parallel. The upper frame 110 and the lower frame 120 may be spaced apart in a z-direction perpendicular to the x-direction and the y-direction.

Each of the upper frame 110 and the lower frame 120 may include a polygonal shape such as a quadrangle. FIG. 1 shows an example of a frame in which each of the upper frame 110 and the lower frame 120 forms a rectangle. However, the shape of each of the upper frame 110 and the lower frame 120 may not be limited thereto, and may vary depending on the shape of the plate 200 to be loaded. According to an embodiment, in case that the planar shape of plate 200 may be circular, each shape of the upper frame 110 and the lower frame 120 may be circular, and in case that the planar shape of the plate 200 may be pentagonal, each shape of the upper frame 110 and the lower frame 120 may be pentagonal. In case that each of the upper frame 110 and the lower frame 120 may be a quadrangle, the upper frame 110 includes four members 111, 112, 113, and 114 that may be connected to each other to form a quadrangle, and the lower frame 120 may also include four members 121, 122, 123, and 124 that may be connected to each other to form a quadrangle.

The members 111, 112, 113, and 114 of the upper frame 110 and corresponding members 121, 122, 123, and 124 of the lower frame 120 may be side by side. FIG. 1 shows a state in which each member 111, 112, 113, and 114 of the upper frame 110 and each member 121, 122, 123, and 124 of the lower frame 120 may be parallel to either the x-direction or the y-direction.

The members 111, 112, 113, and 114 of the upper frame 110 form a space through which the plate 200 may pass through upon loading while being parallel to the x-y plane. The side members 131, 132, 133, 134, and 135 may be disposed between the upper frame 110 and the lower frame 120 and may be connected to the upper frame 110 and to the lower frame 120. The side members 131, 132, 133, 134, and 135 may support the upper frame 110 and the lower frame 120 while maintaining a space between the upper frame 110 and the lower frame 120.

The direction in which the side members 131, 132, 133, 134, and 135 extend may be parallel to each other and may be the same as the z-direction in FIG. 1. The side members 131, 132, 133, 134, and 135 may include two or more first side members 131 connecting the member 111 of the upper frame 110 to the member 121 of the lower frame 120, two or more second side members 132 connecting the member 112 of the upper frame 110 to the member 122 of the lower frame 120, and two or more third side members 135 connecting the member 113 of the upper frame 110 to the member 123 of the lower frame 120.

The first side members 131 and the second side members 132 corresponding to each other may be spaced apart in the x-direction to face each other and be parallel to each other. Each first side member 131 and each second side member 132 includes multiple holes 30 through which supporting parts 140 may pass therethrough and catch. Multiple holes 30 disposed in each first side member 131 and each second side member 132 may be arranged in the z-direction in which the first side member 131 and the second side member 132 extend. The spacing between holes 30 disposed in each first side member 131 and in each second side member 132 may be constant, but may not be limited thereto.

The separation spacing in the x-direction between two or more third side members 135 may be smaller than the width in the x-direction of a side (or edge) of the plate 200 closest to the third side members 135 during the loading so that the loaded plate 200 does not fall out of the plate loading device 100 in the opposite direction to the y-direction. When viewed in the y-direction in FIG. 1, the third side members 135 may be disposed between the supporting parts 140 on the left side and the supporting parts 140 on the right side that face each other.

A side member such as the third side member 135 may not be disposed between the member 114 of the upper frame 110 and the member 124 of the lower frame 120 that face each other. Accordingly, the loaded plates 200 may be loaded or removed through the space between the member 114 of the upper frame 110 and the member 124 of the lower frame 120.

The side members 131, 132, 133, 134, and 135 may further include at least one fourth side member 133 and 134 connecting the corner between two connected members of the upper frame 110 and the corner between two connected members of the lower frame 120. FIG. 1 as an example shows the fourth side member 133 connecting the corner between two connected members 111 and 113 of the upper frame 110 and the corner between two connected members 121 and 123 of the lower frame 120, and the fourth side member 134 connecting the corner between two connected members 112 and 113 of the upper frame 110 and the corner of two connected members 122 and 123 of the lower frame 120.

Each of the members 111, 112, 113, and 114 of the upper frame 110, each of the members 121, 122, 123, and 124 of the lower frame 120, and each of the side members 131, 132, 133, 134, and 135 have a bar shape, and the cross-section of each member may be various, such as circular, oval, polygonal, etc. FIG. 1 shows an example in which the cross-section of each member may be a quadrangular.

Referring to FIG. 2, each supporting part 140 may include a body 141, a head 142, and an end part 143. The body 141 passes through one of the holes 30 of one of the first side member 131 and the second side member 132, and may span the first side member 131 and the second side member 132, respectively. The body 141 may move in the x-direction inside the hole 30.

The body 141 may have various columnar shapes. For example, the body 141 may approximately be a cylinder as illustrated, but may not be limited thereto, and may instead be an elliptical cylinder or a polygonal prism. If the body 141 is a cylinder, it may be rotated while being inserted into the hole 30, however it may be more advantageous to have the cross-section of the body 141 be an oval shape or a polygon instead of a circle so that the body 141 does not rotate while being inserted into the hole 30.

The head 142 may be a part that may be in contact with the plate 200, supports the plate 200, and has a greater width than a largest width of the hole 30 so that the supporting part 140 may not come out of the hole 30. For example, the side of the head 142 may be triangular, and the upper surface of the head 142 that touches the plate 200 may be a quadrangle, but may not be limited thereto. The head 142 may be connected to an end of the body 141.

The end part 143 may be connected to another end of the body 141 and may be disposed on the side opposite to and facing the head 142 with the body 141 in between. The end part 143 may also have a greater width than the largest width of the hole 30 so that the supporting part 140 does not fall out of the hole 30.

Since the head 142 may be heavier than the end part 143, the center of mass of the supporting part 140 may be disposed on the head 142 side. The end part 143 may be attachable to and detachable from the supporting part 140 so that the supporting part 140 may be inserted into and removed from the hole 30. Therefore, the supporting part 140 may be readily replaced.

In FIGS. 1 and 2, the direction of gravity may be different from the x-y plane, and the gravity acting on the plate 200 may act toward the lower frame 120. Also, gravity acting on the plate 200 may include a component directed toward the third side member 135.

Referring to FIGS. 1 and 2, while loading the plate 200 onto the plate loading device 100 according to the embodiment, the plate 200 may pass through the space formed by the members 111, 112, 113, and 114 of the upper frame 110 and then be loaded sequentially in the z-direction starting from the lower frame 120 side. In FIGS. 1 and 2, the loading direction of the plate 200 may be indicated by the first direction DR1.

For example, a robot arm that moves the plate 200 may enter the inside of the plate loading device 100 in the first direction DR1, stop at the position to load the plate 200, load the plate 200, and then exit above the plate loading device 100 again. The loaded plates 200 may face each other in the z-direction and be spaced apart. While the plate 200 moves in the first direction DR1, the plate may be in contact with the third side members 135, slide in the first direction DR1, and move downward.

As the plate 200 passes through the upper frame 110 in the first direction DR1, supporting parts 140 passing by the plate 200 are retracted from the first side member 131 and the second side member 132 to prevent the plate 200 from being caught, and supporting parts 140 in a position to support the plate 200 as shown in FIGS. 1 and 2 may protrude inward, so that the plate 200 may be disposed on the head 142 of the supporting parts 140 so that the plate 200 does not fall out of the plate loading device 100. For example, the supporting parts 140 supporting the current plate 200 being loaded may be disposed inward, but the supporting parts 140 disposed above it may be in a state of being pulled outward.

The distance between two supporting parts 140 facing each other in the x-direction among supporting parts 140 in the position passed by the plate 200 may be greater than the maximum width in the x-direction of the plate 200. As shown in FIG. 1, the supporting parts 140 supporting the loaded plate 200 may be four, but may not be limited thereto. The supporting parts 140 supporting one plate 200 may be four or more so that the plate 200 may be stably supported.

Figure 3:
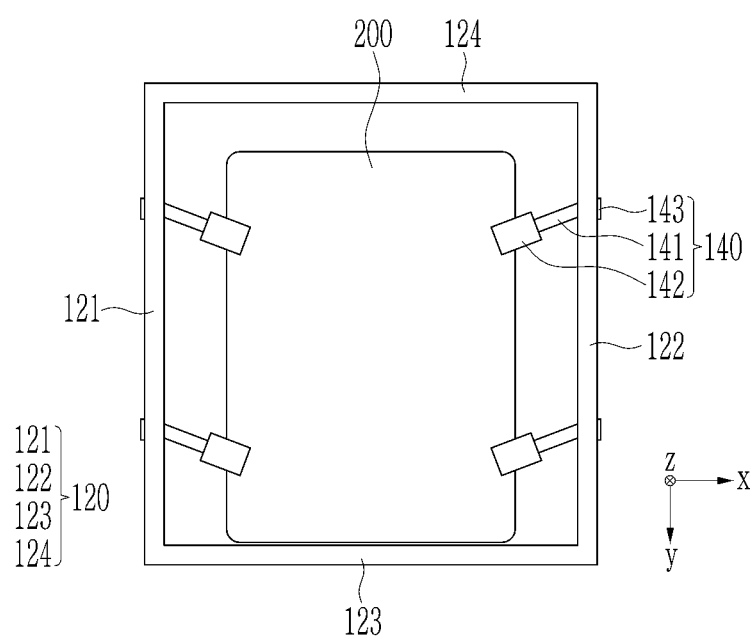
FIG. 3 is a front view of a plate loading device in another direction according to an embodiment.

FIG. 3 is a front view in another direction of a plate loading device 100 according to one embodiment. After loading plates 200 sequentially in the z-direction from the position closest to the lower frame 120, the plate loading device 100 of FIGS. 1 and 2 may be rotated (i.e., tipped over) by 90 degrees toward the y-direction about the x-direction as the axis.

In the process of loading the plates 200, the lower frame 120 may be disposed at the bottom and the upper frame 110 may be disposed at the top, however after the loading is completed, if the plate loading device 100 is turned by 90 degrees (i.e., tipped over) in the y-direction, the third side members 135 may be disposed on the bottom, and the members 114 and 124 on the side facing the third side members 135 may be disposed on the top. In FIG. 3, the side (i.e., peripheral edge) of the loaded plates 200 that faces the third side members 135 may contact (i.e., directly contact) the third side members 135. As a result, the loaded plates 200 may be in a vertical standing state (i.e., are on edge) on the bottom (i.e., on third side members 135) within the plate loading device 100 after the plate loading device 100 is rotated (i.e., tipped over).

In the view of FIG. 3, the side view of the plate loading device 100 is viewed from the lower frame 120 side. In FIG. 3, gravity may act in the y-direction of the plate loading device 100. Referring to FIG. 3, since the center of mass of each supporting part 140 may be disposed at the head 142 side of the supporting part 140, the head 142 side may be directed downward. Accordingly, the supporting part 140 may not fall out of the hole 30 of the plate loading device 100, so that the spacing between the plates 200 may be stably maintained. According to another embodiment, since the extended direction of the body 141 with respect to the extended direction (the y- and z-directions) of the end part 143 may be a direction inclined with respect to the x-direction, the head 142 of the supporting part 140 fitted in a hole 30 in the first side member 131 or the second side member 132 may maintain a more downward sloping orientation than the end part 143 regardless of gravity.

In the state that the plate loading device 100 is tipped over on its side so the third side members 135 are disposed on the bottom, the plate loading device 100 may be moved to a chamber to perform an etching process, a cleaning process, a strengthening process, an inspection process, etc. on the loaded plates 200. Multiple processes may be performed using one plate loading device 100, or an etching process, a cleaning process, a strengthening process, an inspection process, etc. may be performed using different plate loading devices 100. If a separate plate loading device is used for each process, there may be a process of transshipping the plates 200 from one plate loading device to another plate loading device for the next process.

Figure 4:
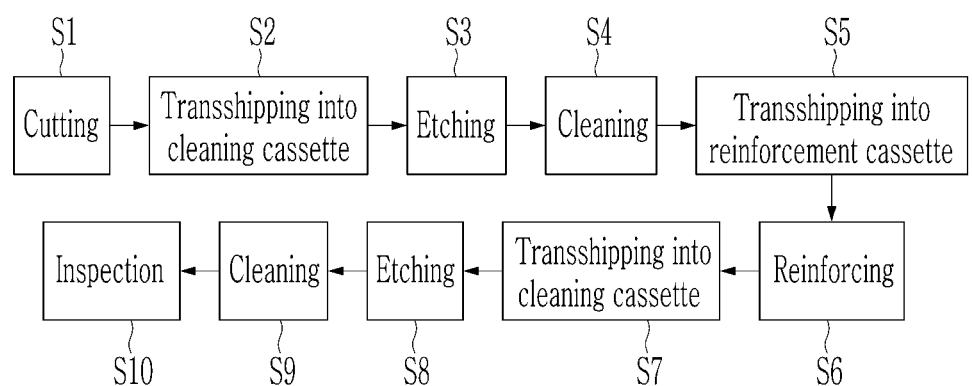
FIG. 4 is a flowchart of a manufacturing process of a display device by using a plate loading device according to an embodiment.

FIG. 4 is a flowchart of a manufacturing process of a display device by using a plate loading device according to an embodiment. Referring to FIG. 4, a mother substrate may be cut for each cell to form multiple plates 200 (S1), and then the plates 200 may be loaded or transported to a plate loading device 100 (referred to as a cleaning cassette) for a primary etching and cleaning process (S2). While the plates 200 may be loaded in the cleaning cassette, an etching process (S3) and a cleaning process (S4) for the plates 200 may be performed. The plates 200 may then be transferred to another plate loading device 100 (referred to as a reinforcement cassette) for a reinforcement process S5. While the plates 200 may be loaded in the reinforcement cassette, the reinforcement process (S6) for the plates 200 may be performed. The plates 200 may then be transferred to another plate loading device 100 (referred to as a cleaning cassette) for a secondary etching and cleaning process (S7). The cleaning cassette at this time may be a same as or different from the cleaning cassette for the primary etching and cleaning process. While the plates 200 may be loaded in the cleaning cassette, an etching process (S8) and a cleaning process (S9) for the plates 200 may be performed. Subsequently, while the plates 200 are still loaded into the cleaning cassette, an inspection process (S10) for the plates 200 may be performed. The process order and process type shown in FIG. 4 may be examples and may not be limited thereto, and may be changed to various other process orders.

Figure 5:
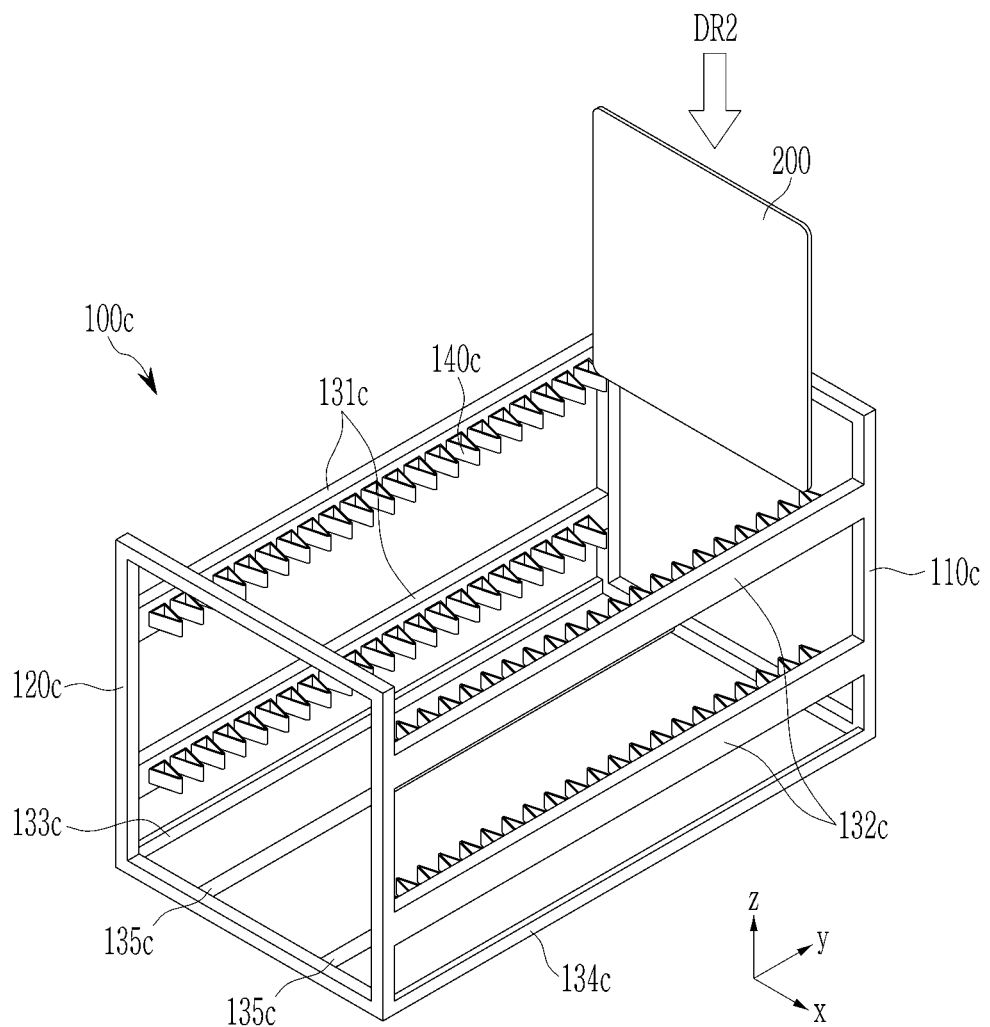
FIG. 5 is a perspective view of a plate loading device according to a comparative example.
Figure 6:
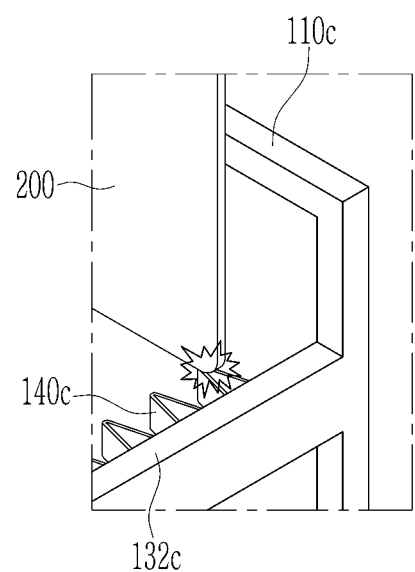
FIG. 6 is a view showing a part of a plate loading device according to a comparative example.

FIG. 5 is a perspective view of a plate loading device according to a comparative example, and FIG. 6 is a view showing a part of a plate loading device according to a comparative example. Referring to FIGS. 5 and 6, a plate loading device 100c according to a comparative example may include an upper frame 110c and a lower frame 120c, side members 131c, 132c, 133c, 134c, and 135c, and slots 140c.

In FIG. 5, gravity may act in the opposite direction to the z-direction, and the upper frame 110c and the lower frame 120c face each other and may be spaced apart in the y-direction. The members constituting the upper frame 110c and the lower frame 120c may extend in the x-direction or the z-direction, respectively.

The side members 131c, 132c, 133c, 134c, and 135c may include two or more first side members 131c connecting the upper frame 110c to the lower frame 120c and two or more second side members 132c facing thereto, and two or more third side members 135c connecting the upper frame 110c to the lower frame 120c. The first side members 131c, the second side members 132c, and the third side members 135c may extend in the y-direction, respectively.

The upper frame 110c, the lower frame 120c, the first side members 131c, and the second side members 132c may form the side of the plate loading device 100c. The first side members 131c and the second side members 132c may form a space through which the plate 200 may pass from above in a state of being parallel to the x-z plane.

Each of the first side members 131c and the second side members 132c may include slots 140c protruding toward the inside of the plate loading device 100c. The slots 140c may extend in a zigzag shape in the y-direction. The plates 200 may be loaded into the plate loading device 100c in the second direction DR2. The plates 200 may be fixed by being sandwiched between adjacent slots 140c. The slots 140c may be fixed to the first side members 131c and the second side members 132c.

Two or more third side members 135c form the bottom of the plate loading device 100c, and may prevent the loaded plates 200 from falling out of the plate loading device 100c. The lower side or peripheral edge of the loaded plates 200 may touch the upper surface of the third side members 135c. The side members 131c, 132c, 133c, 134c, and 135c may further include at least one of fourth side member 133c and 134c that forms a corner of the bottom of the plate loading device 100c and extends in the y-direction.

Referring to FIG. 5, during loading the plates 200 into the plate loading device 100c according to the comparative example, the plates 200 may be sequentially loaded in the y-direction or the opposite direction to the y-direction through the space between the first side member 131c and the second side member 132c in a state of being parallel to the x-z plane. The loaded plates 200 may face each other in the y-direction and may be spaced apart. In FIG. 5, the loading direction of the plates 200 may be indicated by the second direction DR2.

Referring to FIGS. 5 and 6, the loaded plates 200 may be sandwiched between the neighboring slots 140c fixed to the first side members 131c and the second side members 132c, and as shown in FIG. 6, a peripheral edge of each plate 200 may collide with the slot 140c, which may likely cause cracks or other defects. Especially in case that the plates 200 may be fragile as with a thin glass substrate and, due to its weak strength, defects such as chipping, cracking, and scratching easily occur during loading or transshipment of the plate loading devices 100c. As a result, the shape of the slot 140c may change due to repeated loading and transshipment of the plates 200, and therefore the defects such as chipping, cracking, and scratching of the plates 200 may be more likely to occur.

FIG. 7 is a table comparing characteristics of a plate loading device according to a comparative example with a plate loading device according to an embodiment. Specifically, FIG. 7 is a table comparing a process inferiority rate and a transshipment speed according to the comparative example of loading or transshipping the plates 200 using the plate loading device 100c shown in FIGS. 5 and 6 as compared to the embodiment of loading or transshipping the plates 200 using the plate loading device 100 shown in FIGS. 1 to 3. Referring to FIG. 7, in the case according to the embodiment, during the transshipment of the plates, it may be confirmed that the fracture defect rate was very low at 0% compared to the comparative example (5.2%), the chipping defect rate was also as low at 1.0% compared to the comparative example (1.8%), and the scratch defect rate was 1.9% compared to the comparative example (2.9%). In the case of the embodiment, the transshipment speed per plate may be lower at 5.1 s/1 pcs (i.e., 5.1 seconds per piece) compared to the comparative example (6.2 s/1 pcs), so the process efficiency may be high and the process time may be shortened.

According to the embodiment, the supporting parts 140 may be movable in the hole 30 of the first side members 131 and the second side members 132, and the defect of the plates 200 due to the deformation of the supporting parts 140 does not occur. Even if there is deformation of the supporting parts 140, the supporting parts 140 may be readily replaced.

Figure 8:
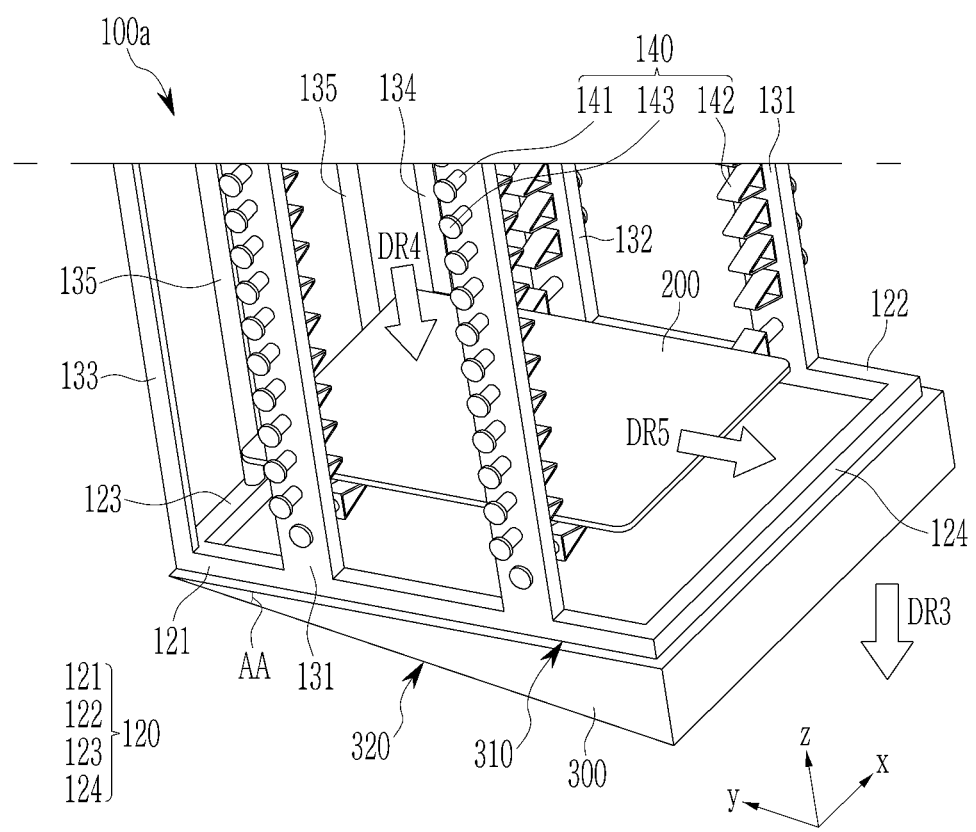
FIG. 8 is a perspective view of a part of a plate loading device according to an embodiment.

A plate loading device 100a according to one embodiment will be described with reference to FIG. 8 together with previously described FIGS. 1 to 3. FIG. 8 is a perspective view of a part of a plate loading device 100a according to an embodiment. Referring to FIG. 8, the plate loading device 100a according to the embodiment may be mostly a same as the plate loading device 100 described above, but also includes the supporter 300, which may be inclined under the lower frame 120, and may be disposed so that the lower frame 120 of the plate loading device 100a may be inclined with respect to the horizontal.

Specifically, the supporter 300 includes an upper inclined surface 310 and a lower bottom surface 320 forming an inclination angle AA of greater than zero with each other. The lower frame 120 of the plate loading device 100a may be placed on the inclined surface 310 so that lower frame 120 is parallel to the inclined surface 310 of the supporter 300 and is inclined to form the inclination angle AA with respect to the bottom surface 320. In FIG. 8, the gravitational direction may be a third direction DR3, and the third direction DR3 may be approximately perpendicular to the bottom surface 320.

The member 123 of the lower frame 120 and multiple third side members 135 connected thereto may be disposed at a lower end of the inclined surface 310, and the member 124 of the lower frame 120 may be disposed at an upper end of the inclined surface 310. The members 121 and 122 of the lower frame 120 may be inclined by the inclination angle AA with respect to the horizontal.

The extending directions of the first side members 131, the second side members 132, and the third side members 135 may be perpendicular to the inclined surface 310. The inclination angle AA may be greater than about 0 degrees and less than about 45 degrees.

In case that the plates 200 may be loaded into the plate loading device 100a, each plate 200 moves in the z-direction or the fourth direction DR4, which may be the direction in which side members 131, 132, 133, 134, and 135 may extend, and the plates 200 may be sequentially loaded. Gravity toward the third direction DR3 includes the vertical component of the fourth direction DR4, and the plates 200 can be loaded toward the lower frame 120 by this component.

According to the embodiment, the loaded plates 200 may be in contact (i.e., direct contact) with the third side members 135 by receiving a force toward the third side members 135 because the surface thereof may be loaded substantially in parallel to the inclined surface 310. Therefore, the risk that the loaded plates 200 fall out of the plate loading device 100a in a direction opposite from where the third side members 135 may be disposed (i.e., a fifth direction DR5 shown in FIG. 8) may be reduced. Therefore, the plates 200 may be loaded more stably by including supporter 300.

While this invention has been described in connection with what is presently considered to be practical embodiments, it is to be understood that the invention may not be limited to the disclosed embodiments. On the contrary, it is intended to cover various modifications and equivalent arrangements included within the spirit and scope of the appended claims.

What is claimed is:

1. A plate loading device, comprising:
   an upper frame facing and spaced-apart from a lower frame in a first direction;
   a plurality of side members disposed between the upper frame and the lower frame and extending in the first direction, wherein
   the plurality of side members include a first side member and a second side member facing each other, and
   the first side member and the second side member each comprise a plurality of holes; and
   a plurality of supporting parts that pass through the plurality of holes, respectively, the plate loading device to load a plurality of plates sequentially in the first direction, wherein
   each of the plurality of supporting parts comprises:
   a body penetrating one hole of the plurality of holes and movable through the hole; a head connected to an end of the body and having a width greater than both a largest width of the hole and a width of the body; and
   an end part connected to another end of the body and having a width greater than both a largest width of the hole and a width of the body,
   the head is heavier than the end part, and
   ones of the plurality of supporting parts that support one of the plurality of plates protrude inward more than others of the plurality of supporting parts disposed above the ones of the plurality of supporting parts that support the one of the plurality of plates.

2. The plate loading device of claim 1, wherein the plurality of holes are arranged in the first direction.

3. The plate loading device of claim 2, wherein spacing between neighboring ones of the plurality of holes arranged in the first direction is constant.

4. The plate loading device of claim 1, wherein the body is movable in the hole in a direction passing through the hole.

5. The plate loading device of claim 1, wherein the head includes a portion having a greater width than the largest width of the hole, and a center of mass of the supporting part is disposed at the head.

6. The plate loading device of claim 5, wherein a lower surface of each of the plurality of plates loaded into the plate loading device directly contacts the head of ones of the plurality of supporting parts.

7. The plate loading device of claim 1, wherein the plurality of side members further comprises a plurality of third side members disposed between the plurality of supporting parts that face each other, and a spacing between ones of the plurality of third side members is smaller than a length of an edge of each of the plurality of plates to be loaded into the plate loading device.

8. The plate loading device of claim 7, wherein during a loading process of the plurality of plates, the edge of the plurality of plates slides in contact with the plurality of third side members.

9. The plate loading device of claim 1, further comprising:
a supporter disposed under the lower frame to support the lower frame,
wherein the supporter includes a bottom surface and an inclined surface having an inclination angle of greater than 0 degrees with respect to the bottom surface.

10. The plate loading device of claim 9, wherein the first side member and the second side member each extend in a direction perpendicular to the inclined surface.

11. The plate loading device of claim 4, wherein a shape of the body is selected from a cylinder, an elliptic cylinder, and a polygonal prism.

12. A plate loading device comprising:
a plurality of first side members facing a plurality of second side members, wherein a plurality of holes are disposed in the plurality of first side members and the plurality of second side members;
a plurality of third side members disposed between the plurality of first side members and the plurality of second side members; and
a plurality of supporting parts respectively disposed in the plurality of holes disposed in the plurality of first side members and the plurality of second side members, wherein
each of the plurality of first side members, the plurality of second side members, and the plurality of third side members extends in a first direction in which each of a plurality of plates is loaded, and
each of the plurality of supporting parts is movable in a corresponding one of the plurality of holes in a second direction perpendicular to the first direction, wherein
each of the plurality of supporting parts comprises:
a body penetrating one hole of the plurality of holes and movable through the hole; a head connected to an end of the body and having a width greater than both a largest width of the hole and a width of the body; and
an end part connected to another end of the body and having a width greater than both a largest width of the hole and a width of the body,
the head is heavier than the end part, and
ones of the plurality of supporting parts supporting one of the plurality of plates protrude inward more than others of the plurality of supporting parts that are positioned above the ones of the plurality of supporting parts that support the one of the plurality of plates.

13. The plate loading device of claim 12, wherein during a loading process of each of the plurality of plates, an edge of each of the plurality of plates slides in contact with the plurality of third side members.

* * * * *